(12) United States Patent
Kim et al.

(10) Patent No.: US 7,619,935 B2
(45) Date of Patent: Nov. 17, 2009

(54) MEMORY DEVICE WITH SEPARATE READ AND WRITE GATE VOLTAGE CONTROLS

(75) Inventors: Kyoung Ho Kim, Hwasung-si (KR); Seong Jin Jang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 322 days.

(21) Appl. No.: 11/680,886

(22) Filed: Mar. 1, 2007

(65) Prior Publication Data

US 2008/0037333 A1 Feb. 14, 2008

(30) Foreign Application Priority Data

Apr. 17, 2006 (KR) ............... 10-2006-0034711

(51) Int. Cl.
*G11C 7/10* (2006.01)
*G11C 7/00* (2006.01)

(52) U.S. Cl. ............... 365/189.02; 365/189.14; 365/189.15; 365/189.16; 365/191

(58) Field of Classification Search ............ 365/189.02, 365/189.15, 189.16, 191
See application file for complete search history.

(56) References Cited

U.S. PATENT DOCUMENTS

2008/0130375 A1* 6/2008 Raghavan et al. ...... 365/189.02

FOREIGN PATENT DOCUMENTS

| KR | 10-1999-0015874 | 3/1999 |
|---|---|---|
| KR | 100206899 | 4/1999 |
| KR | 100266660 | 6/2000 |
| KR | 1020040049175 | 12/2002 |
| KR | 1020030088321 | 11/2003 |
| KR | 1020030088421 | 11/2003 |
| KR | 1020040038449 | 5/2004 |
| KR | 1020050064709 | 6/2005 |

* cited by examiner

*Primary Examiner*—Ly D Pham
(74) *Attorney, Agent, or Firm*—F. Chau & Associates, LLC

(57) ABSTRACT

A circuit and method are provided for controlling the gate voltage of a transistor acting between local and global input/output lines of a memory device, the circuit including a local input/output line, a local from/to global input/output multiplexer in signal communication with the local input/output line, a global input/output line in signal communication with the local from/to global input/output multiplexer, and a local from/to global input/output controller having an input node and an output node, the input node disposed for receiving a signal indicative of an input or output operation, and the output node in signal communication with a gate of the local from/to global input/output multiplexer for providing a gate signal of a first or second level in the presence of the output operation, and a gate signal of a third level in the presence of the input operation.

26 Claims, 14 Drawing Sheets

MEMORY DEVICE WITH SEPARATE READ AND WRITE GATE VOLTAGE CONTROLS

CROSS-REFERENCE TO RELATED APPLICATION

This application claims foreign priority under 35 U.S.C. § 119 to Korean Patent Application No. 10-2006-0034711, filed on Apr. 17, 2006 in the Korean Intellectual Property Office, the disclosure of which is incorporated by reference herein in its entirety.

BACKGROUND OF THE INVENTION

It is generally desirable to achieve high density, low power consumption, and high-speed operation all in the same memory device. Memory devices having conventional chip architectures typically fall short of these goals, particularly as the requirements for density, power consumption and speed are repeatedly extended.

As shown in FIG. 1, a memory device with conventional chip architecture is indicated generally by the reference numeral 10. The memory device 10 includes a plurality of banks like the bank 11 having a plurality of memory cell array blocks BLK1 through BLKn, a plurality of sub-memory cell array blocks blk1 through blkm, a word line WL and a bit line BL, and a hierarchical data line structure including a long data line from cell to data output buffer, i.e., local input/output (I/O) line pairs LIO and LIOB, global I/O line pairs GIO and GIOB, and data I/O fine pairs DIO and DIOB. The memory device 10 further includes a row decoder 12 for decoding a row address RA from an external applied address, and activating a corresponding word line WL: a column decoder 13 for decoding a column address CA activating a column selection line CSL, and generating a block selection signal B_SEL for selecting a sub-memory cell block blk1 through blkm; and a control unit 14 for interpreting an external command com, and providing a write enable signal WE, a local sense amplifier enable BAR signal /LSA_EN, a load signal Load_sig, a local & global I/O selection signal LGIO_MUX, a global I/O selection signal GIO_MUX and a pre-charge control signal LIOEQ.

For High density, the process is scaled down, and the resulting reduced gate oxide thickness (tox) uses a lowered supply voltage to address reliability concerns. For low power consumption in the presence of the lowered power supply voltage, different supply voltages for the cell array and peripheral circuits may be needed. In the cell array, a lower supply voltage is used for high density and reliability concerns. Conversely, in the peripherals a higher supply voltage is used for high-speed operation. Various problems may arise due to the different supply voltages for the cell array and peripheral circuits, particularly in cases where a current-mode data sense amplifier having a load transistor is used.

For example, an unwanted "read reverse-current" phenomenon may occur during read operations, where current from a peripheral or global I/O may degrade operation of the memory cell array. That is, a weak cell fail or bit line sense amplifier malfunction may occur due to a mismatch of resistors of the cell differential nodes or a threshold voltage (Vt) mismatch of transistors in the bit line sense amplifier. Such a fail or malfunction may be more severe if the voltage difference between the cell array and peripheral is larger.

To address the "read reverse-current" phenomenon, the gate voltage of the multiplexer (MUX) connecting local I/O with global I/O can be controlled or lowered. Unfortunately, lowering the gate voltage of the MUX has the undesirable side effect of degrading write operations. The present disclosure addresses these and other issues.

SUMMARY OF THE INVENTION

These and other issues are addressed by an apparatus and method for memory devices with separate read and write gate voltage controls. Exemplary circuits, methods and memory devices are provided.

An exemplary circuit includes a local input/output line, a local from/to global input/output multiplexer in signal communication with the local input/output line, a global input/output line in signal communication with the local from/to global input/output multiplexer, and a local from/to global input/output controller having an input node and an output node, the input node disposed for receiving a signal indicative of an input or output operation, and the output node in signal communication with a gate of the local from/to global input/output multiplexer for providing a gate signal of a first or second level in the presence of the output operation, and a gate signal of a third level in the presence of the input operation Another exemplary circuit is provided for controlling the gate voltage of a transistor acting between local and global input/output lines of a memory device, this circuit including input means for receiving a signal indicative of a read or write mode, first driver means for providing a gate voltage of a first level to the transistor in the read mode in which a selectable local sense amplifier is disabled or the selectable local sense amplifier is not adopted, second driver means for providing a gate voltage of a second level to the transistor in the read mode in which the selectable local sense amplifier is enabled, and third driver means for providing a gate voltage of a third level to the transistor in the write mode.

An exemplary method for controlling the gate voltage of a transistor acting between local and global input/output lines of a memory device includes receiving a signal indicative of a read mode, providing a gate voltage of a first or second level to the transistor in response to the read mode, receiving a signal indicative of a write mode, and providing a gate voltage of a third level to the transistor in response to the write mode wherein the first or second level is lower than the third level.

An exemplary memory device includes at least one dynamic random access memory (DRAM) bank, at least one local input/output line in signal communication with the at least one DRAM bank, at least one local from/to global input/output multiplexer in signal communication with the at least one local input/output line, at least one global input/output line in signal communication with the at least one local from/to global input/output multiplexer, and a local from/to global input/output controller comprising at least one input node and an output node, the at least one input node disposed for receiving a signal indicative of an input or output operation, and the output node in signal communication with a gate of the at least one local from/to global input/output multiplexer for providing a gate voltage of a first or second level in the presence of the output operation, and a gate voltage of a third level in the presence of the input operation.

The present disclosure will be understood from the following description of exemplary embodiments, which is to be read in connection with the accompanying drawings.

BRIEF DESCRIPTION OF THE DRAWINGS

The present disclosure presents an apparatus and method for memory devices with separate read and write gate voltage controls in accordance with the following exemplary figures, wherein like elements may be indicated by like reference characters, and in which.

DETAILED DESCRIPTION OF PREFERRED EMBODIMENTS

The present disclosure presents an apparatus and method for memory devices with separate read and write gate voltage controls. An exemplary embodiment uses two different gate voltages for a multiplexer (MUX) between Local I/O and Global I/O. Here, a lower gate voltage for "read" operations leads to higher resistance, and a higher gate voltage for "write" operations leads to lower resistance. A user selectable local sense amplifier (LSA) also can be employed. A mode register set (MRS) can be used to select (i.e., to enable) the local sense amplifier during read operation.

Figure 2:
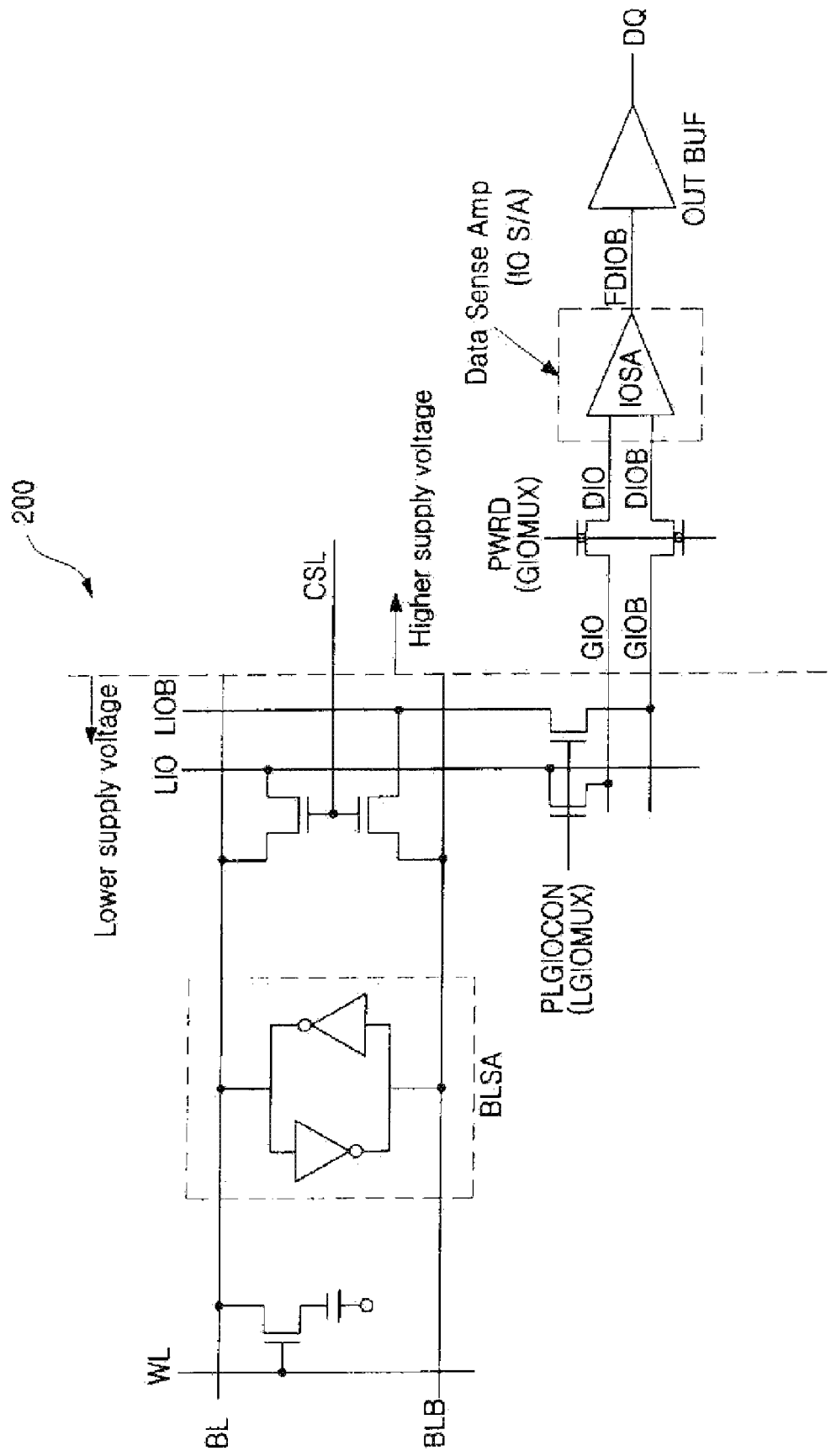
FIG. 2 shows a schematic circuit diagram for a memory device with a read path.

Turning to FIG. 2, a typical read path is indicated generally by the reference numeral 200. The read path 200 includes a word line (WL) in signal communication with bit lines (BL/BLB). The BL/BLB are in signal communication with a bit line sense amplifier (BLSA). The BL/BLB are in signal communication with local I/O lines (LIO/LIOB) via column select transistors responding a column select line (CSL) signal. The LIO/LIOB are in signal communication with global I/O lines (GIO/GIOB) via a multiplexer between the LIO/LIOB and GIO/GIOB. The GIO/GIOB are in signal communication with data I/O lines (DIO/DIOB). The DIO/DIOB, in turn, are in signal communication with a data sense amp or I/O sense amp (IOSA), which is in signal communication with an output buffer for providing output data DQ.

Here, a read operation entails moving cell data via a bit-line sense amplifier (BLSA) through an input/output sense amplifier (IOSA) to an output DQ In addition a local sense amplifier (LSA) can be used in the local input/output (I/O) lines.

Figure 3:
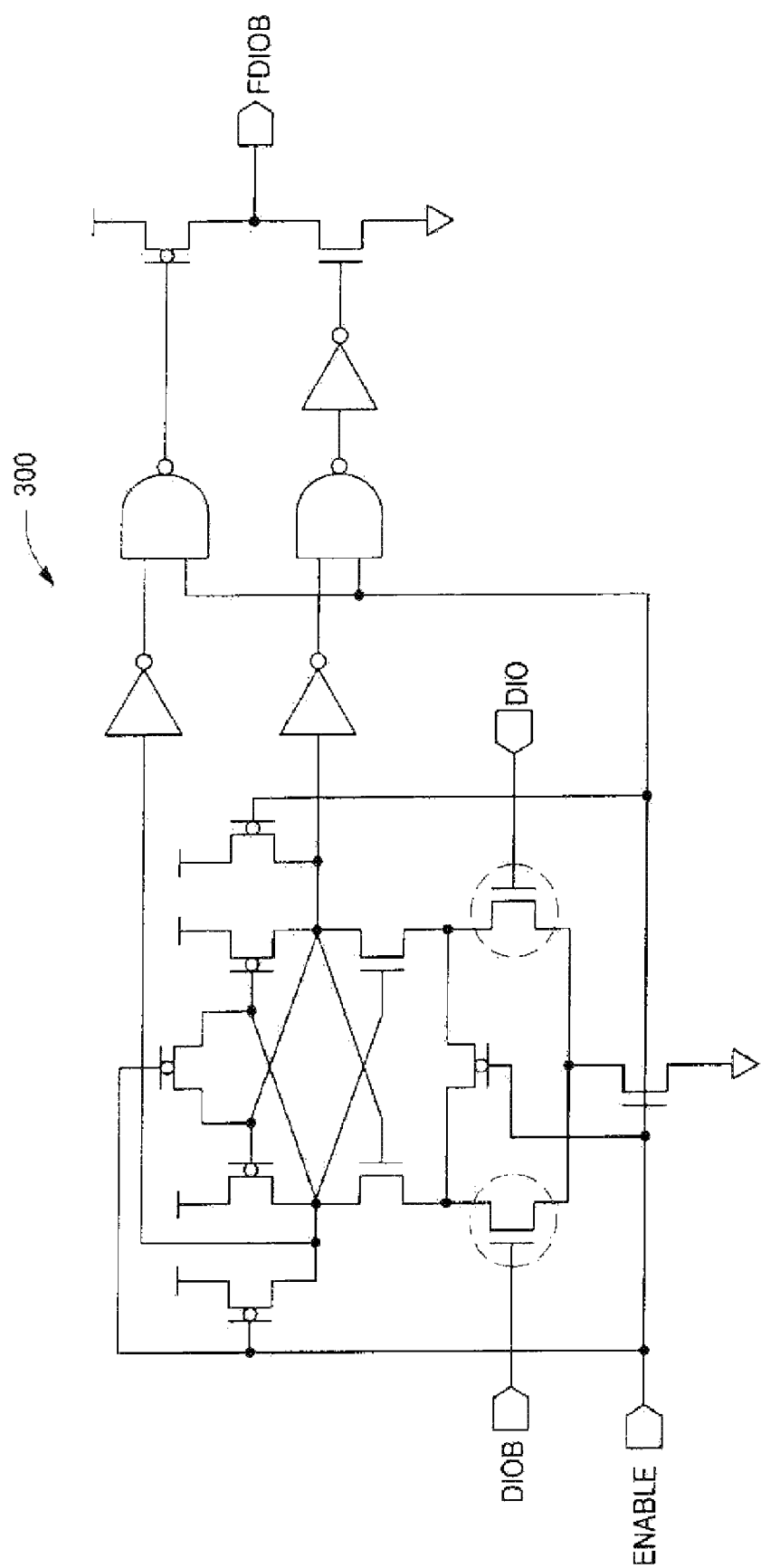
FIG. 3 shows a schematic circuit diagram for a memory device with a voltage-mode data sense amplifier.

Turning now to FIG. 3, a voltage-mode data sense amplifier IOSA is indicated generally by the reference numeral 300. The sense amplifier 300 includes a data input/output (DIO) terminal and an inverted data input/output (DIOB) terminal, each connected to gate terminals of respective NMOS transistors, which, in turn, are each connected to latched data. The amplifier 300 further includes an enable terminal ENABLE and an output terminal FDIOB Since the sense amplifier 300 is a voltage-mode type of sense amplifier, a load transistor (TR) is not needed for global I/O lines (GIO/GIOB).

Figure 4:
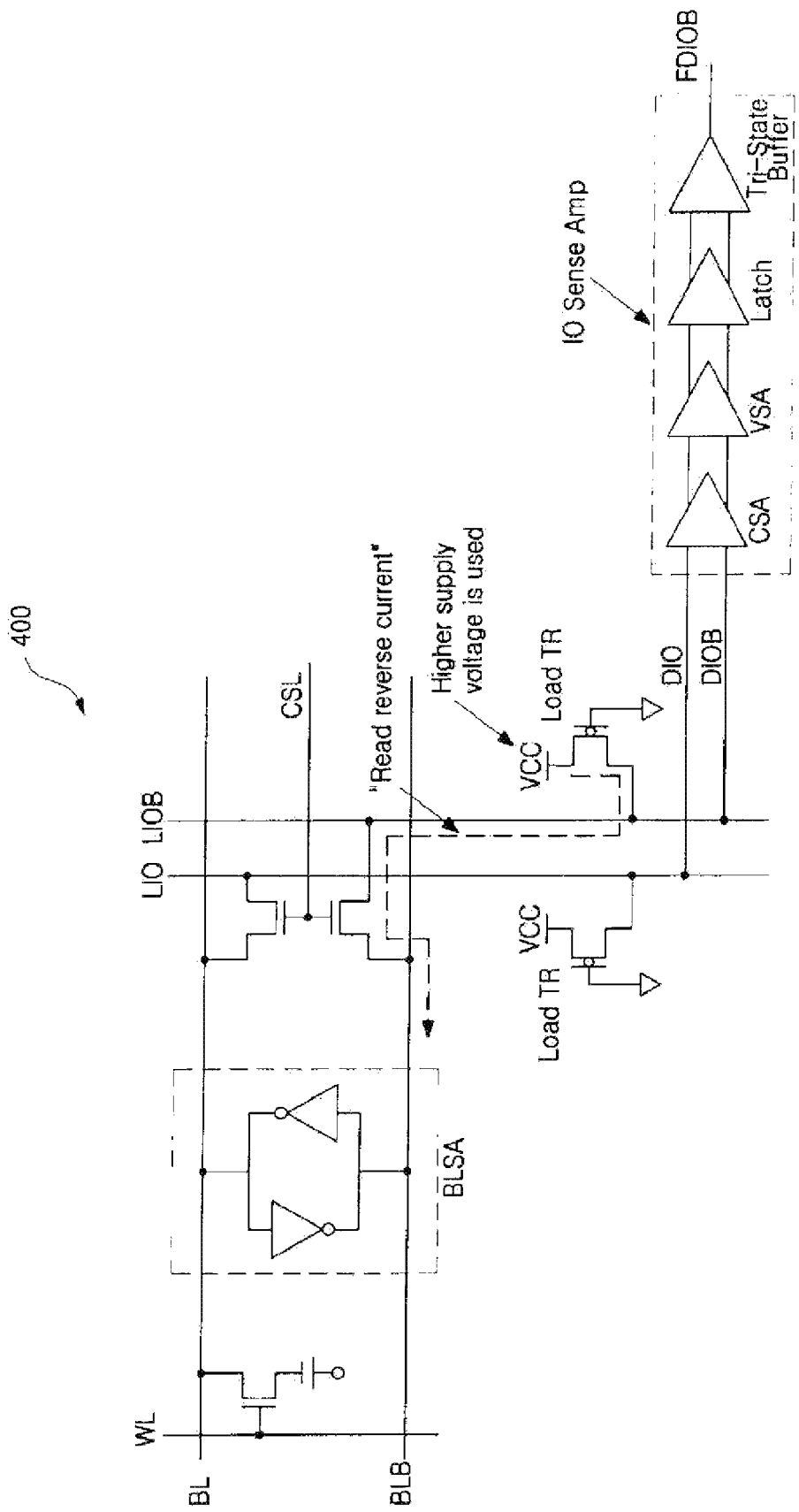
FIG. 4 shows a schematic circuit diagram for a memory device with a current-mode sense amplifier.
Figure 5:
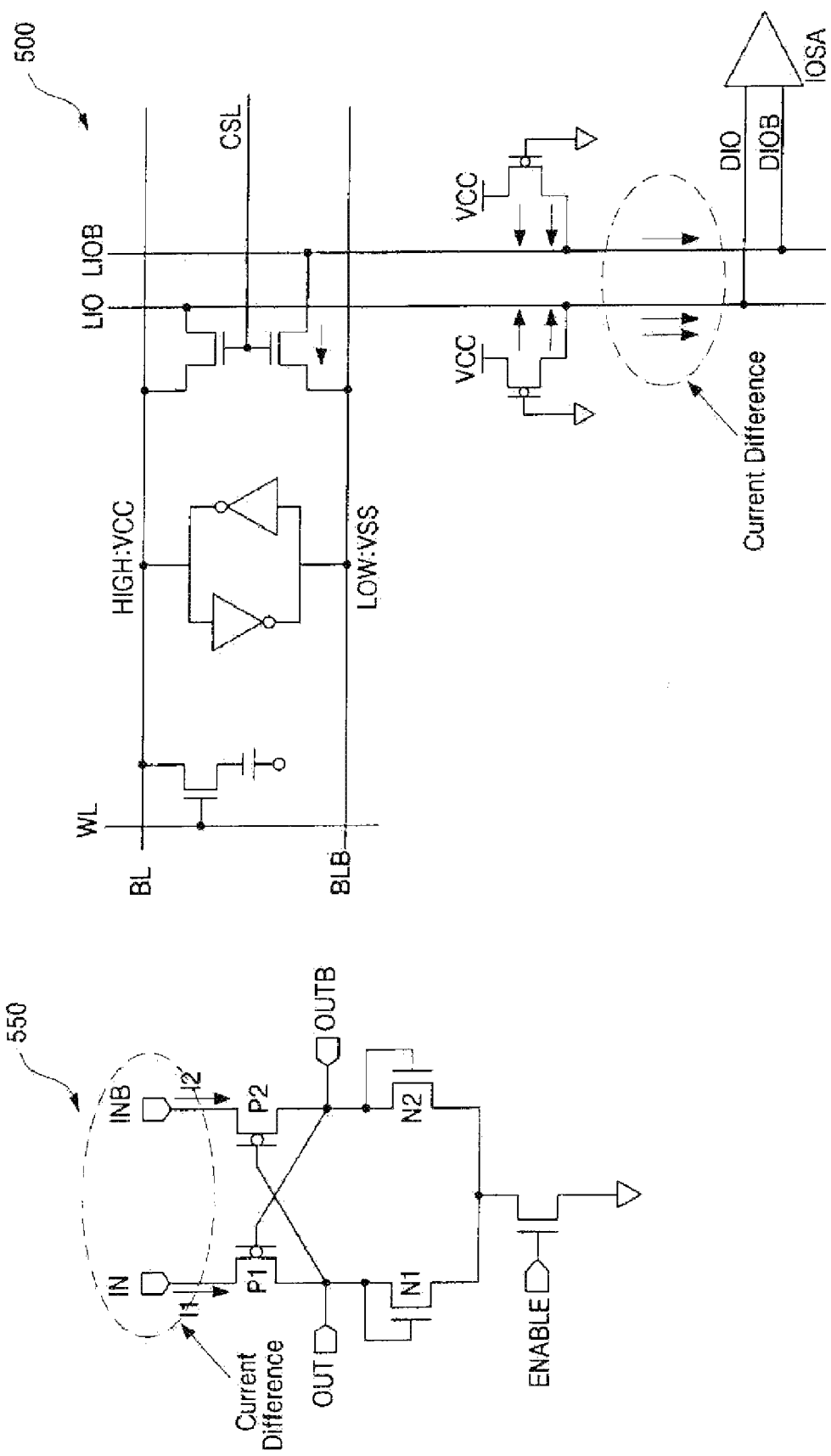
FIG. 5 shows a schematic circuit diagram for a memory device with a current-mode sense amplifier.

As shown in FIG. 4, a read path with a current-mode sense amplifier is indicated generally by the reference numeral 400. The read path 400 is similar to the read path 200 of FIG. 2, except that a load transistor is now required on each of the GIO and GIOB lines. For brevity, the multiplexer between the LIO/LIOB and GIO/GIOB, the multiplexer between the GIO/GIOB and DIO/DIOB, and the GIO/GIOB lines are omitted, and the load transistor is depicted on the LIO/LIOB lines instead of the GLIO/GLIOB lines. On the data I/O side, the read path 400 includes a current-mode sense amplifier IOSA. The current-mode IOSA receives the DIO and DIOB signals with a current sense amplifier (CSA), a voltage sense amplifier (VSA) a latch, and a tri-state buffer. Thus, the current-mode IOSA has 4 stages. The output of the tri-state buffer provides the output signal FDIOB. Here, a higher supply voltage VCC is used, and an unwanted read reverse current may flow from the VCC supply of the load TR on the LIOB line back to the BLB line and the BLSA, for example. Current sensing is faster than voltage sensing. Turning to FIG. 5, the read path for a current-mode IOSA is indicated generally by the reference numeral 500. The read path 500 is similar to the read path 400, and shows a current difference between the LIO and LIOB lines. As in the read path 400, the IOSA includes a current sense amplifier (CSA), here indicated in greater detail by the reference numeral 550. The CSA 550 includes an input terminal IN, a first PMOS transistor PI in signal communication with the input terminal IN, an output terminal OUT in signal communication with the transistor P1, and a first NMOS transistor N1 in signal communication with the output terminal OUT. The CSA 550 further includes an inverted input terminal INB, a second PMOS transistor P2 in signal communication with the inverted input terminal INB an inverted output terminal OUTB in signal communication with the transistor P2, and a second NMOS transistor N2 in signal communication with the inverted output terminal OUTB The first and second NMOS transistors N1 and N2, in turn, are in signal communication with a third NMOS transistor N3, which has its gate terminal in signal communication with an ENABLE input. The third NMOS transistor N3 is then connected to ground. In addition, the gate terminal of the first PMOS transistor P1 is in signal communication with the inverted output terminal OUTB, and the gate terminal of the second PMOS transistor P2 is in signal communication with the output terminal OUT.

Figure 6:
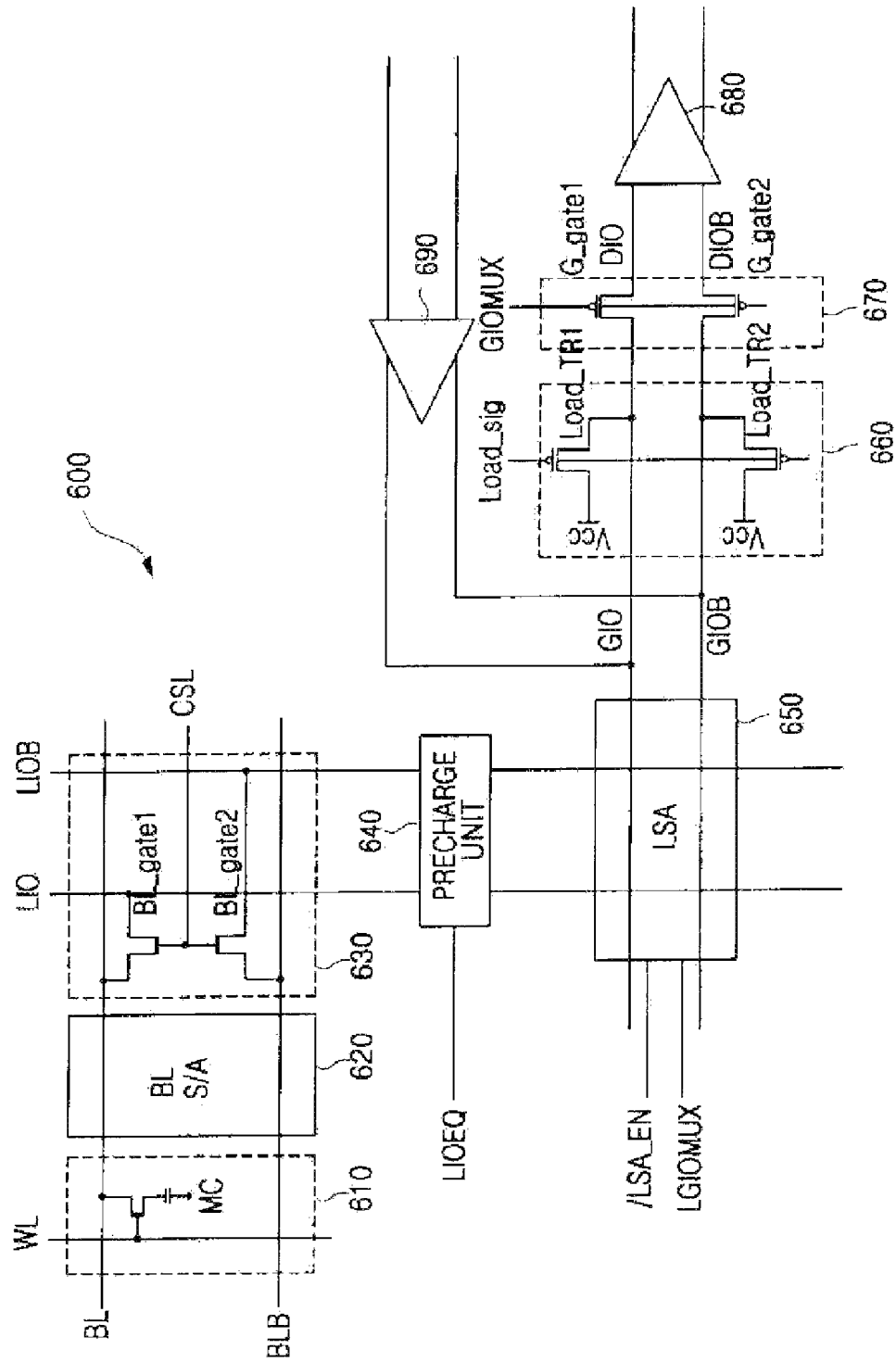
FIG. 6 shows a schematic circuit diagram for a memory device with a local sense amplifier.

Thus, the current sense amplifier 550 has inputs IN and INB that are connected to source nodes of P1 and P2, respectively, and not to the gate nodes as in a voltage-mode sense amplifier. In operation, the sensing operation is performed based on a current difference ($\Delta I = I1 - I2$) between the input lines IN and INB. Turning now to FIG. 6, a circuit having a local sense amplifier (LSA) is indicated generally by the reference numeral 600. The circuit 600 includes a word line WL a bit line BL, and an inverted bit line BLB in signal communication with a memory cell (MC) 610. The cell 610 includes a NMOS transistor with its first terminal in signal communication with the bit line BL, its second terminal in signal communication with a capacitor, and its gate terminal in signal communication with the word line WL. The capacitor, in turn, is connected to ground. The bit fine BL and the inverted bit line BLB are each in signal communication with a bit line sense amplifier (BLSA) 620. The bit line BL and the inverted bit line BLB are each in further signal communication with first terminals of first and second NMOS transistors BL_gate1 and BL_gate2, respectively, of a column selection unit 630, where the gates of the first and second NMOS transistors, respectively, are commonly in signal communication with a column selection line (CSL) signal. Second terminals of the first and second NMOS transistors are in signal communication with local I/O (LIO) and inverted local I/O (LIOB) lines, respectively, which are a local I/O line pair. The LIO and LIOB lines in turn, are in signal communication with a precharge unit 640, which is in signal communication with an equalization signal (LIOEQ). The LIO and LIOB lines are further in signal communication with a local sense amplifier (ISA) 650. The LSA 650 is in signal communication with input signals /LSA_EN and LGIOMUX, as well as global I/O line pair GIO and GIOB. The GIO and GIOB are in signal communication with a load transistor unit 660, a global I/O line selection unit 670 and a current-mode IOSA 680. Also, the GIO and GIOB are each in signal communication with respective outputs of a write driver 690.

The load transistor unit 660 includes first and second PMOS transistors LOAD_TR1 and LOAD_TR2, respectively. A first terminal of LOAD_TR1 is in signal communication with a supply voltage Vcc; its second terminal is in signal communication with GIO; and its gate is in signal communication with an input signal Load_sig. A first terminal of LOAD_TR2 is in signal communication with the supply voltage Vcc its second terminal is in signal communication with GIOB and its gate is in signal communication with the input signal Load_sig. The global I/O line selection unit 670 includes third and fourth PMOS transistors G_gate1 and G_gate2, respectively. A first terminal of G_gate1 is in signal communication with GIO: its gate is in signal communication with an input signal GIOMUX: and its other terminal is in signal communication with a data I/O line DIO. A first terminal of G_gate2 is in signal communication with GIOB; its gate is in signal communication with the input signal GIOMUX; and its other terminal is in signal communication with an inverted data I/O line DIOB. The DIO and DIOB are provided as inputs to the current-mode IOSA 680.

Thus, the circuit 600 uses the LSA to prevent reverse current and to overcome degradation of a write operation. In a read cycle, the LSA 650 amplifies data on local I/O lines and transfers it to global I/O lines. In a write cycle, the LSA 650 transfers data on global I/O lines to local I/O lines. During a read cycle, the load transistor unit 660 provides current to global I/O lines, which is needed when a current-mode data sense amplifier is adopted for the IOSA amplifier 680.

Here for high-speed sensing operations in global I/O lines and data I/O lines, a current-mode data sense amplifier is used for the IOSA 680 instead of a voltage-mode data sense amplifier. The load transistor unit 660 is used for current-mode sensing. A higher power supply voltage (Vcc) in the load transistors may be used for high-speed, but this would tend to increase an undesirable read reverse-current under the prior art. In the circuit 600, the local sense amplifier (LSA) 650 substantially blocks the read reverse-current.

In addition, to overcome degradation of write operations, the gate voltage of a MUX connecting local I/O with global I/O can be increased. When using the LSA 650 to prevent a read reverse-current, loss of area more current and/or greater timing margins for controlling the extra LSA may result.

Figure 7:
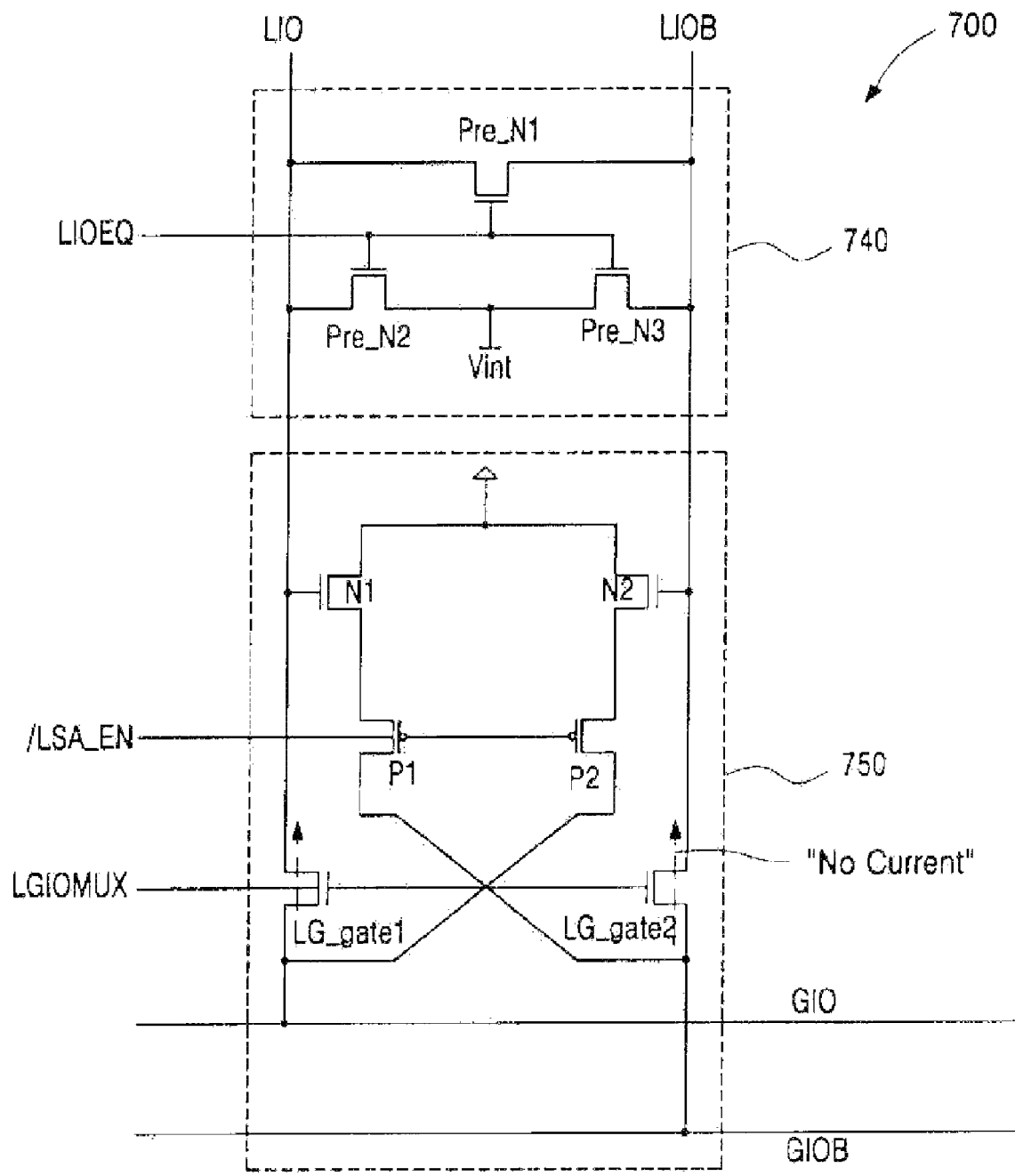
FIG. 7 shows a schematic circuit diagram for a memory device with a local sense amplifier.

Turning to FIG. 7, a local sense amplifier (LSA) and a precharge unit are generally indicated by the reference numeral 700. The precharge unit 740 includes a first NMOS transistor Pre_N1 having a first terminal in signal communication with LIO and a second terminal in signal communication with LIOB. A gate of the transistor pre_N1 is in signal communication with an input LIOEQ. The input LIOEQ is further in signal communication with gates of second and third NMOS transistors Pre_N2 and Pre_N3 respectively. LIO is in signal communication with a first terminal of Pre_N2. A second terminal of Pre_N2 is in signal communication with a first terminal of Pre_N3 as well as in signal communication with a supply voltage Vint. A second terminal of Pre_N3 is in signal communication with LIOB.

The local sense amplifier (LSA) 750 includes an NMOS transistor N1 having a gate in signal communication with LIO a first terminal in signal communication with ground and a second terminal in signal communication with a first terminal of a PMOS transistor P1. The PMOS transistor P1 has a gate in signal communication with a /LSA_EN signal, and a second terminal in signal communication with GIOB. Another NMOS transistor is a first local/global gate transistor LG_gate1, having a first terminal in signal communication with LIO, a gate in signal communication with LGIOMUX signal, and a second terminal in signal communication with GIO. The local sense amplifier (LSA) 750 further includes an NMOS transistor N2 having a gate in signal communication with LIOB, a first terminal in signal communication with ground and a second terminal in signal communication with a first terminal of a PMOS transistor P2. The PMOS transistor P2 has a gate in signal communication with a /LSA_EN signal, and a second terminal in signal communication with GIO. Another NMOS transistor is a second local/global gate transistor LG_gate2, having a first terminal in signal communication with LIOB, a gate in signal communication with LGIOMUX signal, and a second terminal in signal communication with GIOB.

In operation, the precharge unit 740 provides equalization of LIO and LIOB in response to LIOEQ signal. The local sense amplifier (LSA) 750 amplifies the data on LIO and LIOB in response to /LSA_EN and provides the amplified data to GIO and GIOB. The circuit 700 uses the LSA to prevent reverse current and to overcome degradation of write operations. In read mode, /LSA_EN is low level (LSA is "ON"), LGIOMUX signal is low level (the first and second local/global gate transistors LG_gate1. LG_gate2 are "OFF"), and LIO/LIOB and GIO/GIOB are not directly connected through the first and second local/global gate transistors LG_gate1, LG_gate2. Here, the LIO pair is connected to the gates of the N1 and N2 transistors. In write mode for a write operation, the high voltage level of the LGIOMUX signal can be raised, such as with the LSA 650 of FIG. 6.

Figure 8:
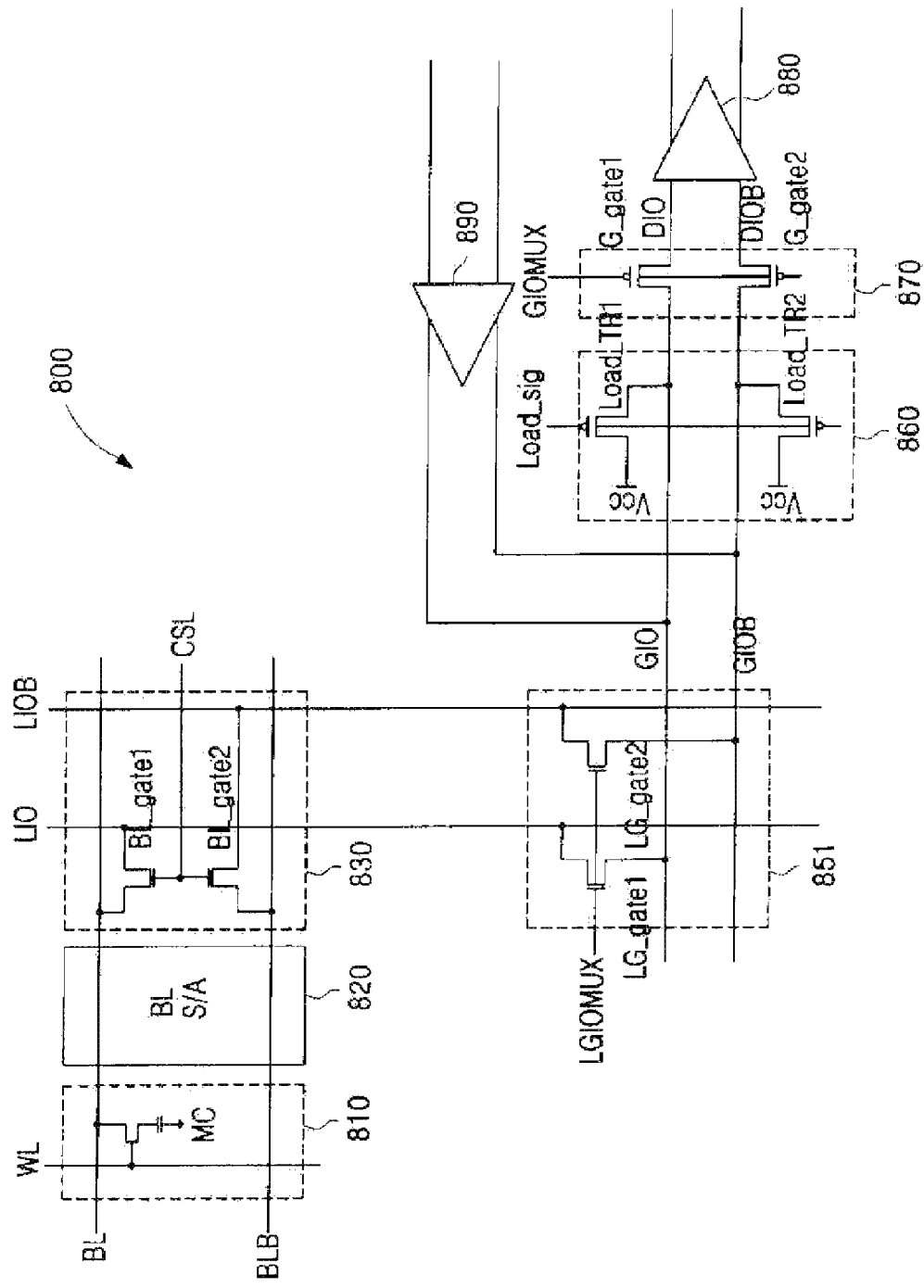
FIG. 8 shows a schematic circuit diagram for a memory device with a gate unit.

Turning now to FIG. 8, a circuit for local and global I/O is indicated generally by the reference numeral 800. The circuit 800 is similar to the circuit 600 of FIG. 6. An I/O gate unit 851 includes first and second local to global gate transistors LG_gate1 and LG_gate2 which are connecting LIO/LIOB with GIO/GIOB in response to LGIOMUX signal.

The circuit 800 does not have a local sense amplifier, i.e., the local sense amplifier is not adopted and thus does not need a precharge unit. The I/O gate unit 851 may also comprise a multiplexer (MUX). In this scheme without an LSA, two local and global I/O gates LG_gate1 and LG_gate2 are used. To prevent a read mode reverse current, a logic high voltage level of the LGIOMUX signal can be lowered. A resistance value of the local and global I/O transistors is increased, thus a write operation may be degraded if the write driver 890 has a current that is less easily transferred to a memory cell 910 via the local and global I/O transistors LG_gate1 and LG_gate2.

Figure 1:
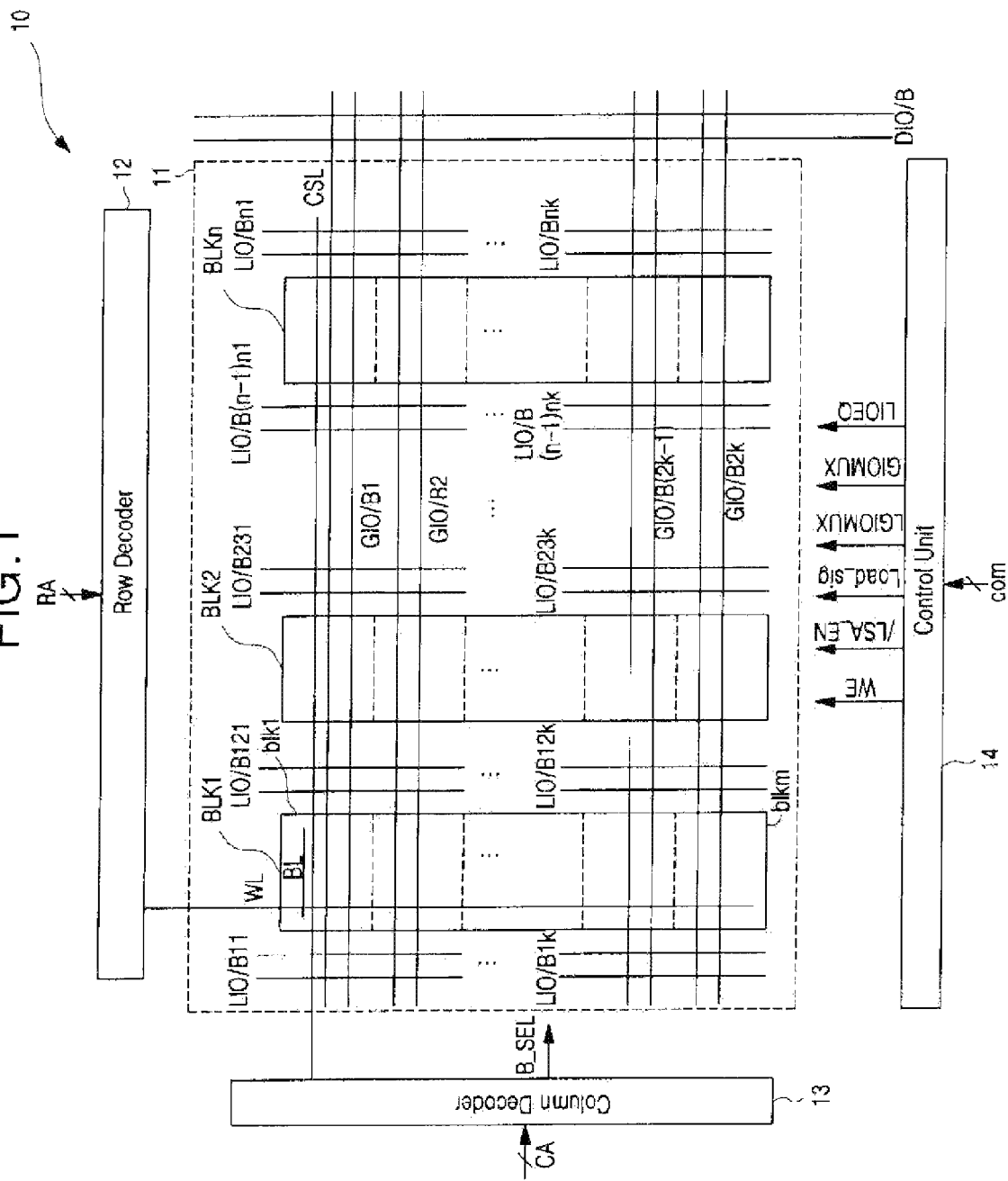
FIG. 1 shows a schematic circuit diagram for a memory device having a conventional chip architecture.
Figure 9:
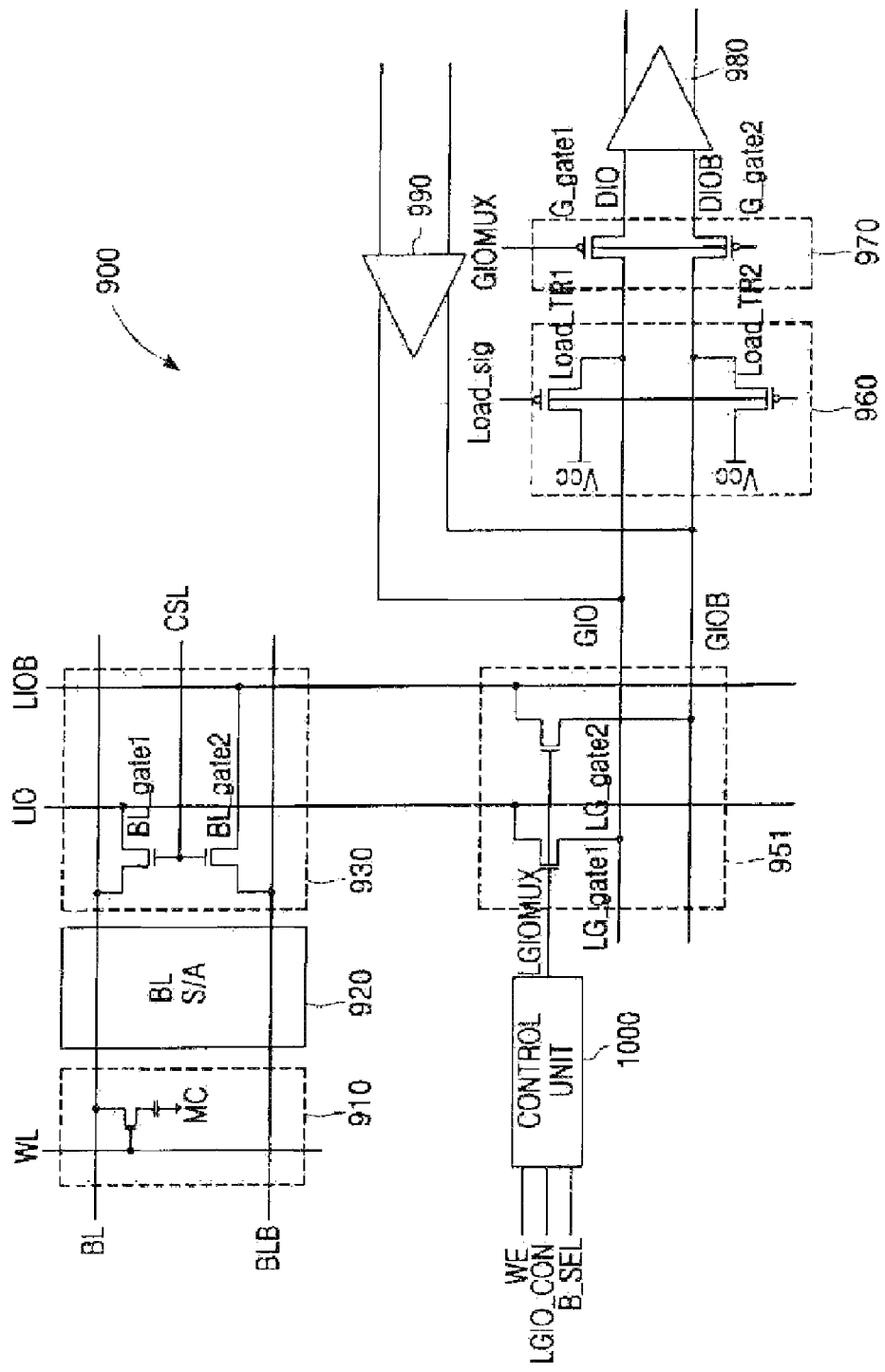
FIG. 9 shows a schematic circuit diagram for a memory device with a local and global I/O control unit in accordance with one embodiment of the present disclosure.

As shown in FIG. 9, a preferred embodiment circuit without a local sense amplifier (LSA is not adopted) is indicated generally by the reference numeral 900. The circuit 900 is similar to the circuit 800 of FIG. 8, and duplicate description will be omitted. The circuit 900 further includes a local and global I/O control unit 1000, the control unit 1000 in signal communication with input signals Write Enable Signal (WE), local and global I/O control signal (LGIO_CON) and Block Selection Signal (B_SEL). An output of the control unit 1000 provides the LGIOMUX signal to the gates of the LG_gate1 and LG_gate2 transistors. In operation, the local and global I/O control signal LGIO_CON may be generated from another control unit, such as the control unit 14 of FIG. 1, to provide an LGIOMUX signal.

Figure 10:
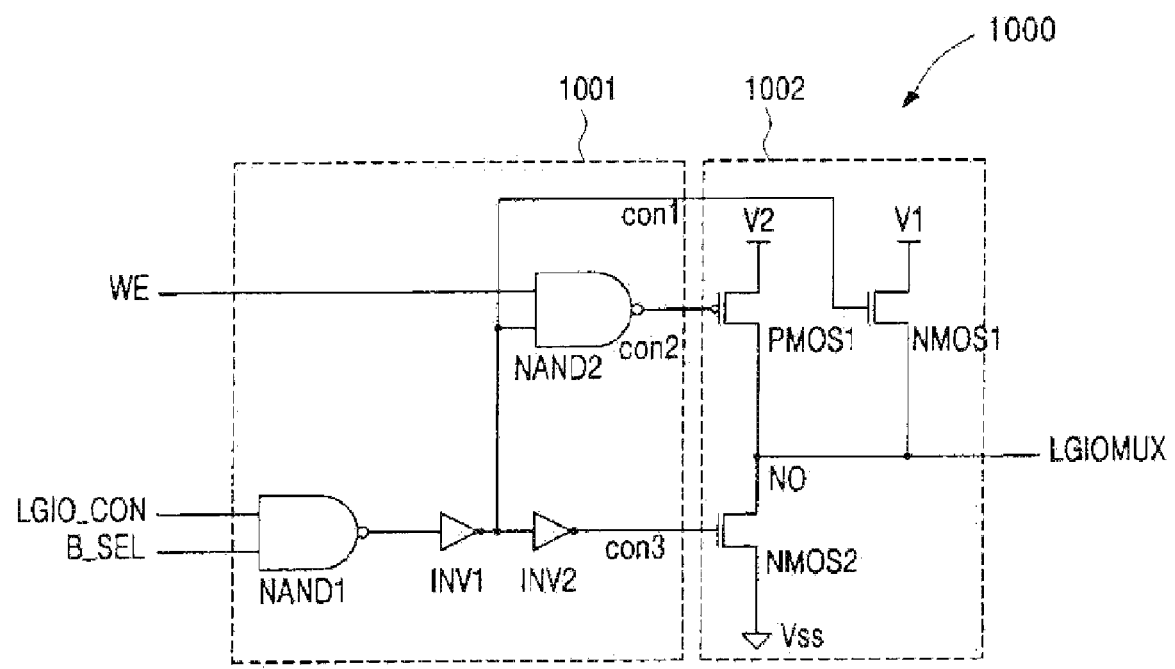
FIG. 10 shows a schematic circuit diagram for a memory device with a local and global I/O control unit in accordance with one embodiment of the present disclosure.

Turning to FIG. 10, the local and global I/O control unit 1000 of FIG. 9 is here indicated generally by the reference numeral 1000. The unit 1000 includes control signal generator or first portion 1001 and a driving unit or second portion 1002. The control signal generator 1001 includes a first NAND gate NAND1 for receiving the LGIO_CON and B_SEL signals. The output of NAND1 is in signal communication with a first inverter INV1. The output of the inverter INV1 is provided as a-control output con1 of the control signal generator 1001. The output of the inverter INV1 is further in signal communication with an input of a second inverter INV2. The output of the inverter INV2 is provided as a control output con3 of the control signal generator 1001. The output of the inverter INV1 is further in signal communication with an input of a second NAND gate NAND2. Another input of NAND2 is for receiving the WE signal. The output of NAND2 is provided as a control output con2 of the control signal generator 1001. The driving unit 1002 includes a PMOS transistor PMOS1 having a first terminal in signal communication with a voltage V2, a gate in signal communication with con2, and a second terminal in signal communication with the output signal LGIOMUX. The driving unit 1002 further includes a first NMOS transistor NMOS1 having a first terminal in signal communication with a voltage V1, a gate m signal communication with con1, and a second terminal in signal communication with the output signal LGIOMUX. The driving unit 1002 further includes a second NMOS transistor NMOS2 having a first terminal in signal communication with a voltage Vss, a gate in signal communication with con3, and a second terminal in signal communication with the output signal LGIOMUX.

In operation, the local and global I/O control unit 1000 generates different gate voltages for read and write operation modes. In a read mode, WE is at a Low level, LGIO_CON is at a High level B_SEL is at a High level, and NMOS1 turns ON causing LGIOMUX to output a voltage signal of V1 minus Vthn, where Vthn is the threshold voltage of the NMOS transistor NMOS1. In a write mode, WE is at a High level, LGIO_CON is at a High level, B_SEL is at a High level, and NMOS1 turns ON causing LGIOMUX to tend to output a voltage signal of V1 minus Vthn. PMOS1 is also ON, which causes LGIOMUX to output a voltage signal of V2. Thus, the higher V2 level can be the logic high level of the LGIOMUX signal. For example, the supply voltage for PMOS1 and NMOS1 can be V1 and V2 having the same voltage level as external VCC (EVCC). Alternatively, V1 can have the EVCC level, and V2 can have a boosted voltage level. In other alternate embodiments, the logic gate combination can be changed, and/or con2 can be used as con1. In a write mode, only PMOS1 can be ON.

In absence of any read or write operation (For example, LGIO_CON or/and B_SEL is at a low level and WE is don't care), NMOS2 turns ON causing LGIOMUX to output a voltage signal of ground. Thus, NMOS type LG_gate1 and LG_gate2 transistors are turned off.

Figure 11:
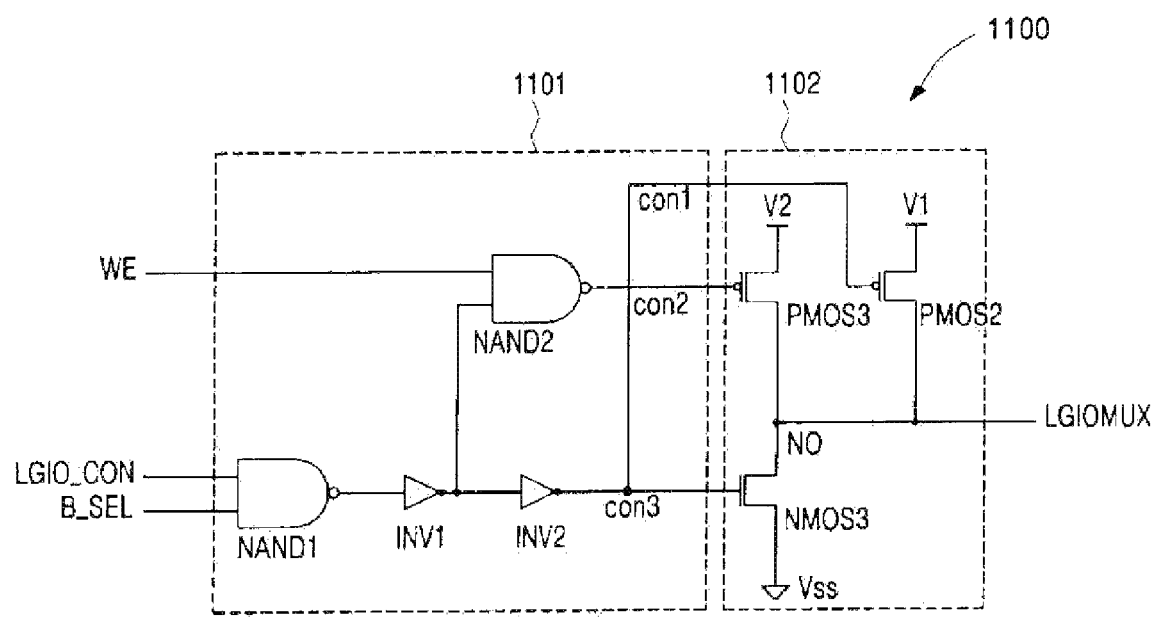
FIG. 11 shows a schematic circuit diagram for a memory device with a local and global I/O control unit in accordance with one embodiment of the present disclosure.

Turning now to FIG. 11, another embodiment of the local and global I/O control unit 1000 of FIG. 9 is here indicated generally by the reference numeral 1100. The unit 1100 includes a control signal generator 1101 and a driving unit 1102. The control signal generator 1101 includes a first NAND gate NAND1 for receiving the LGIO_CON and B_SEL signals. The output of NAND1 is in signal communication with a first inverter INV1. The output of the inverter INV1 is in signal communication with an input of a second inverter INV2. The output of the inverter INV2 is provided as control outputs con1 and con3 of the control signal generator 1101. The output of the inverter INV1 is further in signal communication with an input of a second NAND gate NAND2. Another input of NAND2 is for receiving the WE signal. The output of NAND2 is provided as a control output con2 of the control signal generator 1101. The driving unit 1102 includes a PMOS transistor PMOS3 having a first terminal in signal communication with a voltage V2 agate in signal communication with con 2, and a second terminal in signal communication with the output signal LGIOMUX. The driving unit 1102 further includes another PMOS transistor PMOS2 having a first terminal in signal communication with a voltage V1, a gate in signal communication with con1, and a second terminal in signal communication with the output signal LGIOMUX. The driving unit 1102 further includes an NMOS transistor NMOS3 having a first terminal in signal communication with a voltage Vss, a gate in signal communication with con3, and a second terminal in signal communication with the output signal LGIOMUX. In operation, PMOS2 and PMOS3 are used to generate different gate voltages for read and write operation modes. In a read mode, WE is at a Low level, LGIO_CON is at a High level, B_SEL is at a High level, and PMOS2 turns ON causing LGIOMUX to have the V1 voltage level. In a write mode, WE is at a High level, LGIO_CON is at a High level, B_SEL is at a High level. PMOS3 turns ON causing LGIOMUX to tend towards the voltage level of V2, and PMOS2 also turns ON causing LGIOMUX to rise to the level of V1. Here, V2 should be higher than V1. For the logic high level of the LGIOMUX signal in a write mode, the supply voltages for PMOS3 and PMOS2 may be, for example V1 at the internal VCC (Vint) voltage level and V2 at the external VCC (EVGC) voltage level. Alternately, the supply voltages may be V1 at the EVCC level, and V2 at a boasted voltage level.

Figure 12:
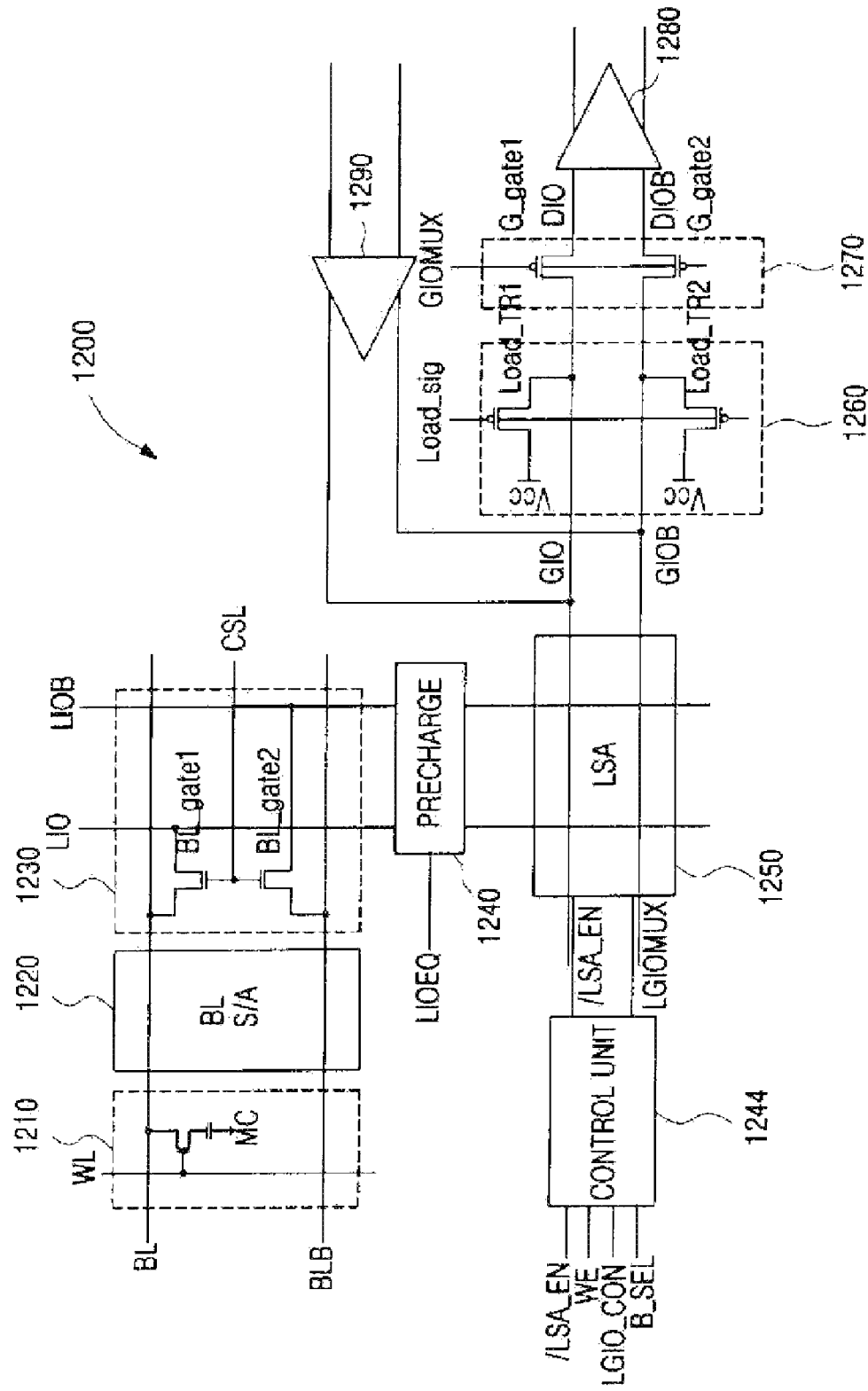
FIG. 12 shows a schematic circuit diagram for a memory device with a local sense amplifier in accordance with one embodiment of the present disclosure.

As shown in FIG. 12, a circuit having a local sense amplifier (LSA) is indicated generally by the reference numeral 1200. The circuit 1200 is similar to the circuit 600 of FIG. 6, and duplicate description will be omitted. The circuit 1200 further includes a local and global I/O control unit 1244 for receiving signals for /LSA_EN, WE, LGIO_CON and B_SEL. The control unit 1244 is in signal communication with the local sense amplifier (LSA) 1250 for providing /LSA_EN and LGIOMUX signals to the LSA 1250. In operation, the circuit 1200 operates with an optional (i.e., selectable in read mode) LSA scheme. Here, the /LSA_EN signal is added to the control unit 1244. The LSA is optional in a read mode and enabled by the /LSA_EN signal.

Figure 13:
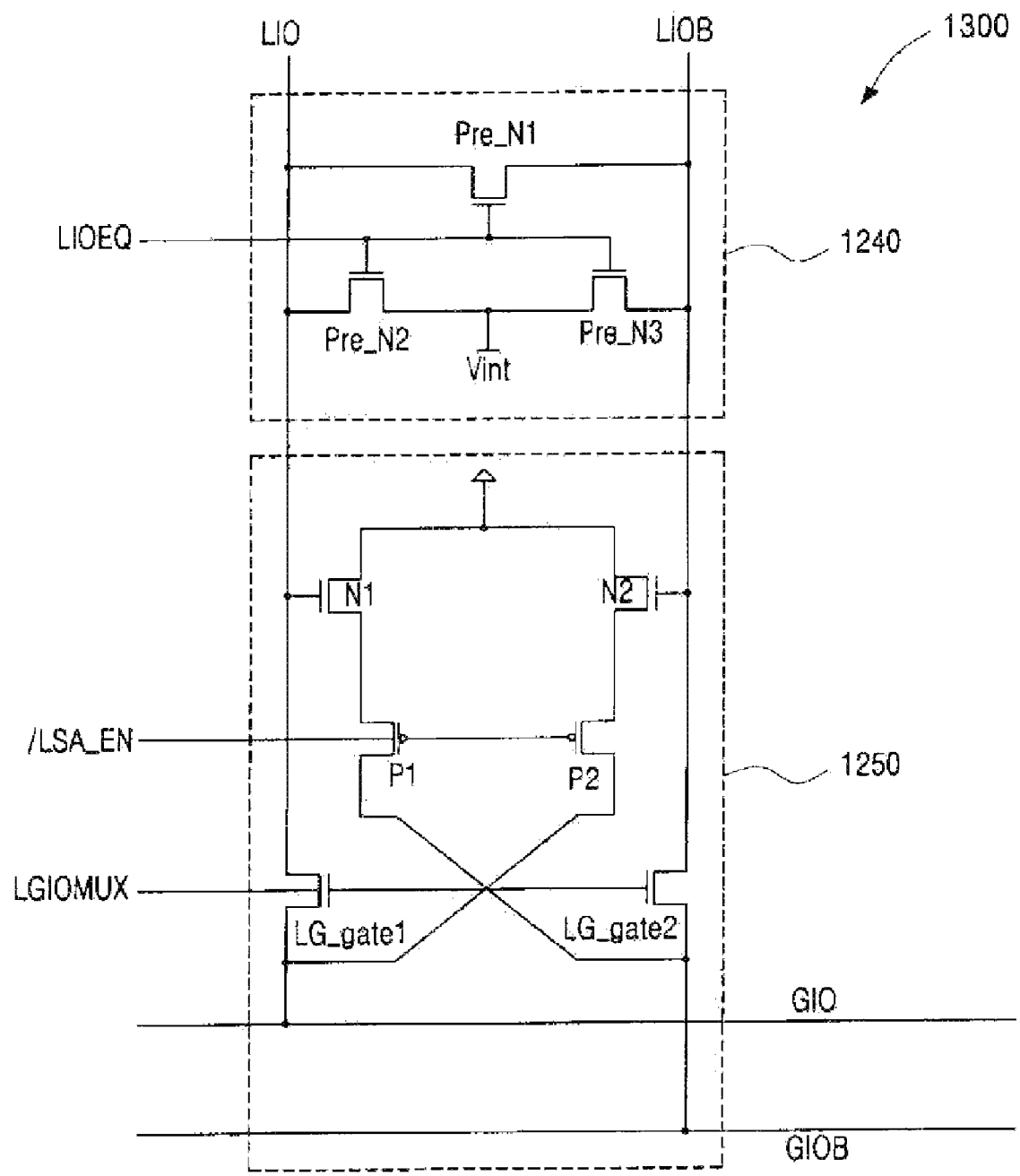
FIG. 13 shows a schematic circuit diagram for a memory device with a precharge unit and local sense amplifier in accordance with one embodiment of the present disclosure.

Turning to FIG. 13, a portion of the circuit 1200 of FIG. 12 is indicated generally by the reference numeral 1300. Here, the precharge unit 1240 and the LSA 1250 are shown in greater detail. The precharge unit 1240 includes a first NMOS transistor Pre_N1 having a first terminal in signal communication with LIO and a second terminal in signal communication with LIOB. A gate of the transistor Pre_N1 is in signal communication with a precharge control signal LIOEQ. The input LIOEQ is further in signal communication with gates of second and third NMOS transistors Pre_N2 and Pre_N3 respectively. LIO is in signal communication with a first terminal of Pre_N2. A second terminal of Pre N2 is in signal communication with a first terminal of Pre_N3 as well as in signal communication with a supply voltage Vint corresponding to an internal supply voltage. A second terminal of Pre_N3 is in signal communication with LIOB.

The LSA 1250 includes an NMOS transistor N1 having a gate in signal communication with LIO, a first terminal in signal communication with ground and a second terminal in signal communication with a first terminal of a PMOS transistor P1. The PMOS transistor PI has a gate in signal communication with a /LSA_EN signal, and a second terminal in signal communication with GIOB. Another NMOS transistor is a first local/global gate transistor LG_gate1, having a first terminal in signal communication with LIO, a gate in signal communication with LGIOMUX, and a second terminal in signal communication with GIO. The LSA 1250 further includes an NMOS transistor N2 having a gate in signal communication with LIOB, a first terminal in signal communication with ground and a second terminal in signal communication with a first terminal of a PMOS transistor P2. The PMOS transistor P2 has a gate in signal communication with a /LSA_N signal, and a second terminal in signal communication with GIO. Another NMOS transistor is a second local/global gate transistor LG_gate2, having a first terminal in signal communication with LIOB, a gate in signal communication with LGIOMUX and a second terminal in signal communication with GIOB.

Figure 14:
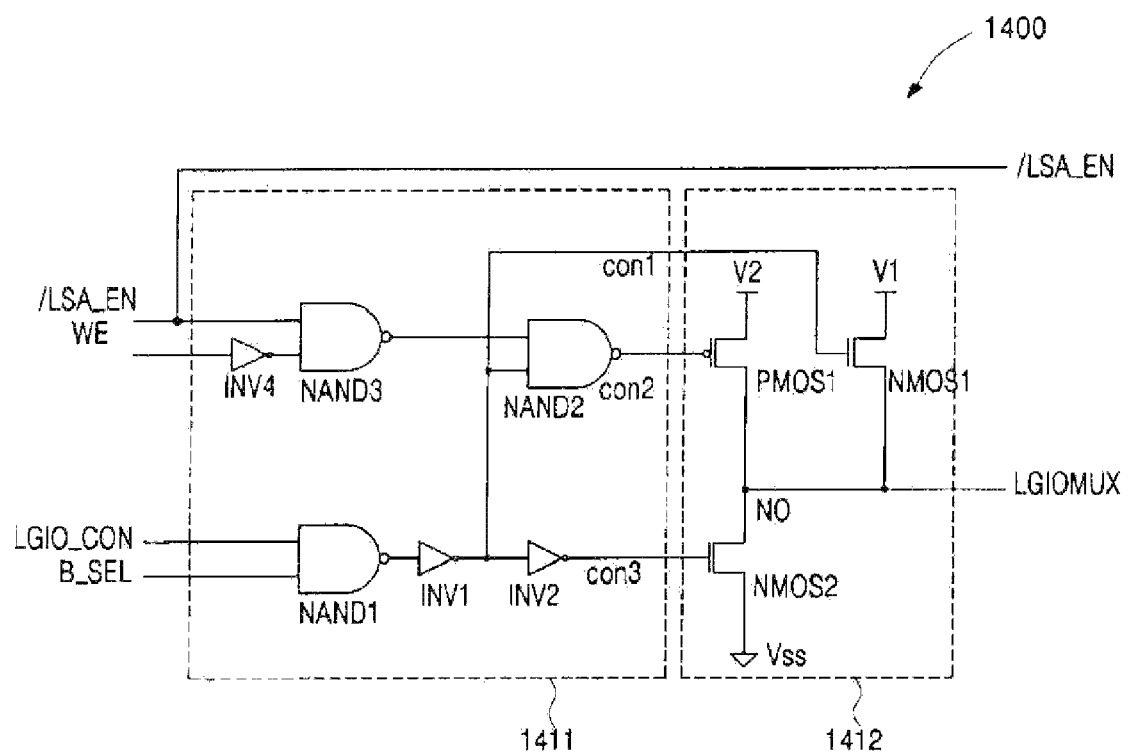
FIG. 14 shows a schematic circuit diagram for a memory device with a control unit in accordance with one embodiment of the present disclosure.

Turning now to FIG. 14, another portion of the circuit 1200 of FIG. 12 is indicated generally by the reference numeral 1400. Here, an embodiment of the control unit 1244 is indicated generally by the reference numeral 1400. The unit 1400 includes a control signal generator 1411 and a driving unit 1412. The control signal generator 1411 includes a first NAND gate NAND1 for receiving the LGIO_CON and B_SEL signals. The output of NAND1 is in signal communication with a first inverter INV1. The output of the inverter INV1 is provided as a control output con1 of the control signal generator 1411. The output of the inverter INV1 is further in signal communication with an input of a second inverter INV2. The output of the inverter INV2 is provided as a control output con3 of the control signal generator 1411. The output of the inverter INV1 is further in signal communication with an input of a second NAND gate NAND2. Another input of NAND2 is for receiving an output of a third NAND gate NAND3. The inputs to the third NAND gate NAND3 include the WE signal and the /LSA_EN signal. The /LSA_EN signal is also passed directly to an output of the driving unit 1412. The output of NAND2 is provided as a control output con2 of the control signal generator 1411. The driving unit 1412 includes a PMOS transistor PMOS1 having a first terminal in signal communication with a voltage V2, a gate in signal communication with con2, and a second terminal in signal communication with the output signal LGIO-MUX. The driving unit 1412 further includes a first NMOS transistor NMOS1 having a first terminal in signal communication with a voltage V1, a gate in signal communication with con1, and a second terminal in signal communication with the output signal LGIOMUX. The driving unit 1412 further includes a second NMOS transistor NMOS2 having a first terminal in signal communication with a voltage Vss, a gate in signal communication with con3 and a second terminal in signal communication with the output signal LGIO-MUX.

In operation, the LSA may be ON in a read mode. Here, /LSA_EN is at a Low level, WE is at a Low level. LGIO_CON is at a Low level, B_SEL is at a High level, PMOS1 and NMOS1 are OFF, and NMOS2 turns ON causing LGIOMUX to be Low, where LG-gate1 and LG-gate2 are both OFF. In a write mode, /LSA_EN is at a High level, WE is at a High level, LGIO_CON is at a High level, B_SEL is at a High level, and PMOS1 and NMOS1 are both ON causing LGIOMUX to be at the V2 higher level.

The LSA may be OFF in a read mode. Here, /LSA_EN is at a High level. WE is at a Low level, LGIO_CON is at a High level B_SEL is at a High level PMOS1 is OFF, and NMOS1 is ON causing LGIOMUX to be V1-Vthn. In a write mode, /LSA_EN is at a High level, WE is at a High level. LGIO_ CON is at a High level, B_SEL is at a High level, and PMOS1 and NMOS1 are both ON causing LGIOMUX to be at the V2 higher level. In absence of any read or write operation (For example. LGIO_CON or/and B_SEL is at a low level, WE and /LAS_EN are don't care). NMOS2 turns ON causing LGIOMUX to output a voltage signal of ground. Thus, NMOS type LG_gate1 and LG_gate2 transistors are turned off.

As will be understood by those skilled in the art the exemplary logic gate combinations can be changed in various ways to achieve similar results.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is

1. A circuit comprising:
   at least one local input/output line;
   at least one local from/to global input/output multiplexer in signal communication with the at least one local input/output line;
   at least one global input/output line in signal communication with the at least one local from/to global input/output multiplexer; and
   a local from/to global input/output controller comprising at least one input node and an output node, the input node disposed for receiving a signal indicative of an input or output operation, and the output node in signal communication with a gate of the at least one local from/to global input/output multiplexer for providing a gate signal of a first or second level in the presence of the output operation, and a gate signal of a third level in the presence of the input operation.

2. A circuit as defined in claim 1 wherein:
   the at least one local from/to global input/output multiplexer comprises a NMOS transistor;
   the controller comprises a voltage controller;
   the first, second and third gate signals comprise first, second and third gate voltages, respectively;
   the signal indicative of the input operation comprises a write enable signal;
   the gate signal of the first level is a high voltage level responsive to the output operation; and the gate signal of the third level is a higher or boosted voltage level responsive to the input operation.

3. A circuit as defined in claim 2, the voltage controller further comprising another input node disposed for receiving a signal indicative of a block selection,
Wherein the gate signals are enabled in response to the block selection.

4. A circuit as defined in claim 3, further comprising a control unit for providing a local and global input/output control signal:
the voltage controller further comprising another input node disposed for receiving the local and global input/output control signal from the control unit;
wherein the gate signals are enabled in response to the local and global input/output control signal.

5. A circuit as defined in claim 4, the voltage controller further comprising:
a first NAND gate disposed for receiving the signal indicative of the block selection and the local and global input/output control signal; and
a second NAND gate in signal communication with an output of the first NAND gate and disposed for receiving the signal indicative of the input operation.
wherein an output of the second NAND gate is in signal communication with the gate terminal of a transistor, and the output of the first NAND gate is in signal communication with the gate terminals of two transistors.

6. A circuit as defined in claim 1, the circuit further comprising a local sense amplifier in signal communication with the at least one local input/output line, the voltage controller further comprising another input node disposed for receiving a signal indicative of the local sense amplifier being enabled;
wherein if the local sense amplifier is enabled in the output operation, the gate signal of the second level which is a low voltage level is provided so that the at least one local from/to global input/output multiplexer is turned off, if the local sense amplifier is disabled in the output operation, the gate signal of the first level which is a high voltage level is provided, and the gate signal of the third level which is a higher or boosted voltage level is provided in the input operation.

7. A circuit as defined in claim 6, the voltage controller further comprising:
a first NAND gate disposed for receiving a signal indicative of a block selection and a local and global input/output control signal;
a second NAND gate disposed for receiving the signal indicative of the input operation and the signal indicative of the local sense amplifier being enabled; and
a third NAND gate in signal communication with an output of the first NAND gate and an output of the second NAND gate;
wherein an output of the third NAND gate is in signal communication with the gate terminal of a transistor, and the output of the first NAND gate is in signal communication with the gate terminals of two transistors.

8. A circuit as defined in claim 1, further comprising at least one load transistor in signal communication with the at least one global input/output line, wherein an undesired read reverse current may be substantially prevented during the output operation by providing the gate signal of the first or second level to the gate of the at least one local from/to global input/output multiplexer, and the first or second level is lower than the third level.

9. A circuit as defined in claim 8, further comprising at least one current sense amplifier in signal communication with the at least one global input/output line via at least one global from/to data input/output multiplexer, wherein the at least one load transistor is activated during the output operation.

10. A circuit as defined in claim 9, further comprising at least one write driver in signal communication with the at least one global input/output line, wherein a write current may be substantially increased during the input operation by providing the gate signal of the third level to the gate of the at least one local from/to global input/output multiplexer, and the third level is higher than the first or second level.

11. A circuit as defined in claim 1, the local from/to global input/output controller further comprising at least three driver transistors, the first driver transistor disposed for providing the gate signal of the first level, the second driver transistor disposed for providing the gate signal of the second level, and the third driver transistor disposed for providing the gate signal of the third level.

12. A circuit as defined in claim 11, the local from/to global input/output controller further comprising a plurality of logic gates in signal communication with the driver transistors, the plurality of logic gates disposed for receiving signals indicative of a write enable and a block select.

13. A circuit as defined in claim 12 wherein the plurality of logic gates are further disposed for receiving at least one of a signal indicative of a local sense amplifier enable or a local and global input/output selection.

14. A circuit as defined in claim 11 wherein the first level is substantially a high voltage, the second level is substantially grounded, and the third level is substantially a higher or boosted voltage.

15. A circuit as defined in claim 14 wherein the first driver transistor has a threshold voltage drop greater than the third driver transistor.

16. A circuit as defined in claim 1 wherein the at least one local input/output line is disposed in signal communication with a dynamic random access memory (DRAM).

17. A memory device comprising:
at least one dynamic random access memory (DRAM) bank;
at least one local input/output line in signal communication with the at least one DRAM bank;
at least one local from/to global input/output multiplexer in signal communication with the at least one local input/output line;
at least one global input/output line in signal communication with the at least one local from/to global input/output multiplexer; and
a local from/to global input/output controller comprising at least one input node and an output node, the at least one input node disposed for receiving a signal indicative of an input or output operation, and the output node in signal communication with a gate of the at least one local from/to global input/output multiplexer for providing a gate voltage of a first or second level in the presence of the output operation, and a gate voltage of a third level in the presence of the input operation.

18. A memory device as defined in claim 17, the local from/to global input/output controller further comprising:
input means for receiving the signal indicative of the input or output operation;
first driver means for providing the gate voltage of the first level to the multiplexer in the output operation in which a selectable local sense amplifier is disabled or the selectable local sense amplifier is not adopted;
second driver means for providing the gate voltage of the second level to the multiplexer in the output operation in which the selectable local sense amplifier is enabled; and third driver means for providing the gate voltage of the third level to the multiplexer in the input operation.

19. A memory device as defined in claim 17, further comprising at least one load transistor in signal communication with the at least one global input/output line, wherein an undesired read reverse current may be substantially prevented during the output operation by providing the gate voltage of the first or second level to the gate of the at least one local from/to global input/output multiplexer, and the first or second level is lower than the third level.

20. A memory device as defined in claim 19, further comprising at least one current sense amplifier in signal communication with the at least one global input/output line via at least one global from/to data input/output multiplexer, wherein the at least one load transistor is activated during the output operation.

21. A memory device as defined in claim 17, further comprising at least one write driver in signal communication with the at feast one global input/output line, wherein a write current may be substantially increased during the input operation by providing the gate voltage of the third level to the gate of the at least one local from/to global input/output multiplexer, and the third level is higher than the first or second level.

22. A memory device as defined in claim 17, the local from/to global input/output controller further comprising at least three driver transistors the first driver transistor disposed for providing the gate voltage of the first level, the second driver transistor disposed for providing the gate voltage of the second level, and the third driver transistor disposed for providing the gate voltage of the third level.

23. A memory device as defined in claim 17, the local from/to global input/output controller further comprising a plurality of logic gates in signal communication with the driver transistors, the plurality of logic gates disposed for receiving signals indicative of a write enable and a block select.

24. A memory device as defined in claim 23 wherein the plurality of logic gates are further disposed for receiving at least one of a signal indicative of a local sense amplifier enable or a local and global input/output selection.

25. A memory device as defined in claim 22 wherein the first level is substantially a high voltage, the second level is substantially grounded, and the third level is substantially a higher or boosted voltage.

26. A memory device as defined in claim 25 wherein the first driver transistor has a threshold voltage drop greater than the third driver transistor.

* * * * *